United States Patent
Luo et al.

(10) Patent No.: US 9,365,768 B2
(45) Date of Patent: Jun. 14, 2016

(54) WHITE LIGHT EMITTING DIODE, MANUFACTURING METHOD AND PACKAGING MATERIAL THEREOF

(71) Applicants: Guan-Jie Luo, Taipei (TW); Kai Hsiung Tsai, Taipei (TW)

(72) Inventors: Guan-Jie Luo, Taipei (TW); Kai Hsiung Tsai, Taipei (TW)

(73) Assignee: Guan-Jie Luo, Taipei (TW)

( * ) Notice: Subject to any disclaimer, the term of this patent is extended or adjusted under 35 U.S.C. 154(b) by 0 days.

(21) Appl. No.: 14/704,899

(22) Filed: May 5, 2015

(65) Prior Publication Data

US 2016/0005934 A1    Jan. 7, 2016

(30) Foreign Application Priority Data

May 8, 2014   (TW) .............................. 103116396 A (51) Int. Cl.
| | |
|---|---|
| H01L 33/00 | (2010.01) |
| C09K 11/77 | (2006.01) |
| H01L 33/50 | (2010.01) |
| H01L 33/64 | (2010.01) |
| C08K 13/02 | (2006.01) |
| C08L 63/00 | (2006.01) |
| C08L 83/00 | (2006.01) |
| C09K 5/14 | (2006.01) |
| H01L 23/00 | (2006.01) |
| H01L 33/56 | (2010.01) |

(52) U.S. Cl.
CPC ............ *C09K 11/7706* (2013.01); *C08K 13/02* (2013.01); *C08L 63/00* (2013.01); *C08L 83/00* (2013.01); *C09K 5/14* (2013.01); *C09K 11/7774* (2013.01); *H01L 24/97* (2013.01); *H01L 33/501* (2013.01); *H01L 33/56* (2013.01); *H01L 33/641* (2013.01); *C08L 2203/202* (2013.01); *H01L 2224/32225* (2013.01); *H01L 2224/48091* (2013.01); *H01L 2224/48227* (2013.01); *H01L 2224/73265* (2013.01); *H01L 2924/181* (2013.01); *H01L 2933/0041* (2013.01); *H01L 2933/0075* (2013.01)

(58) Field of Classification Search
CPC ..... H01L 33/507; H01L 33/60; H01L 33/483; H01L 33/54; H01L 33/58; B82Y 20/00; B82Y 30/00; B82Y 40/00
USPC .......................................................... 257/98
See application file for complete search history.

(56) References Cited

U.S. PATENT DOCUMENTS

| | | | | |
|---|---|---|---|---|
| 2010/0044640 | A1* | 2/2010 | Agrawal | C08G 59/30 252/301.36 |
| 2010/0291374 | A1* | 11/2010 | Akarsu | B82Y 20/00 428/328 |
| 2012/0112219 | A1* | 5/2012 | Jang | B82Y 20/00 257/98 |
| 2013/0334559 | A1* | 12/2013 | Vdovin | H01L 33/507 257/98 |

* cited by examiner

*Primary Examiner* — Trung Q Dang
(74) *Attorney, Agent, or Firm* — Anna Tsang (57) ABSTRACT

A white light emitting diode comprising a substrate layer, two conductive frames, a light emitting unit, two conductive wires, and a packaging element is provided. The substrate layer is made from a curing reaction of first mixture, and the first mixture includes a curable resin, a curing agent, a phosphor material, and a modified thermal conductive nano-material, wherein the modified thermal conductive nano-material is made from a thermal conductive nano-material and a silane compound. The packaging element is made from a curing reaction of second mixture, and the second mixture includes a curable resin, a curing agent, a phosphor material, and a modified thermal conductive nano-material, wherein the modified thermal conductive nano-material is made from a thermal conductive nano-material and a silane compound. The chip-type white light emitting diode has a good heat-dissipating effect and a good luminous efficiency without additional heat dissipation fins. In addition, the manufacturing method of the chip-type white light emitting diode is a relatively simple process for mass production.

17 Claims, 5 Drawing Sheets

//  WHITE LIGHT EMITTING DIODE, MANUFACTURING METHOD AND PACKAGING MATERIAL THEREOF

BACKGROUND OF THE INVENTION

1. Field of the Invention

The present invention relates to a white light emitting diode, particularly to a chip-type white light emitting diode including a substrate layer and a packaging element, wherein the substrate layer and the packaging element are both made from a mixture including a curable resin, a curing agent, a phosphor material, and a modified thermal conductive nanomaterial.

2. Description of Related Art

In traditional light emitting diode device, the heat generated from the light emitting diode chip almost transfer to a heat-dissipating substrate by a heat-dissipating material, and then heat dissipate to surroundings by the heat-dissipating substrate. The heat is generated more quickly with an increased power of the light emitting diode chip, and be unable to heat dissipate through the heat conduction path timely and effectively. This makes light emitting diode chip damage and has a short lifetime. Therefore, how to heat dissipate for the light emitting diode chip effectively is an important issue.

Figure 1:
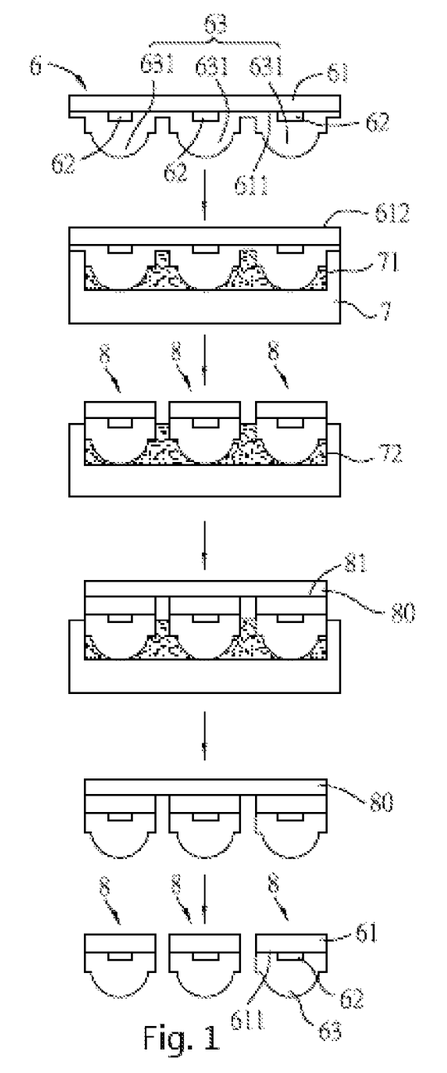
FIG. 1 is a schematic view illustrating a conventional LED manufacturing method.

TW patent publication No. 201304196 discloses a manufacturing method of a back-cutting light emitting diode (LED). Referring to FIG. 1 of No. 201304196, the manufacturing method of the back-cutting LED comprises the steps: (1) providing an array-type LED package structure 6 which includes a ceramic substrate 61, multiple light emitting units 62 disposed on a front-surface 611 of the ceramic substrate and coupled to the ceramic substrate 61, and a lens set 63 formed on the front-surface 611 of the ceramic substrate and covered the light emitting units 62, wherein the lens set 63 includes multiple lens 631 corresponding to the light emitting units 62 respectively; (2) disposing the array-type LED package structure 6 in a jig 7 which being filled with liquid resins 71, wherein the lens set 63 being toward and conduct the liquid resins 71, and the ceramic substrate 61 has a back-surface 612 of the ceramic substrate, which being exposed and corresponding to the ceramic substrate front-surface 611; (3) curing the liquid resins 71 to form a solid colloidal 72, this makes the array-type LED package structure 6 being fixed relative to the location of the jig 7 by the solid colloidal 72. Next, cutting the ceramic substrate 61 and lens set 63 of the array-type LED package structure 6 to form multiple back-cutting LED package structures 8 in a direction toward the solid colloidal 72 from the back-surface 612 of the ceramic substrate; (4) attaching a tape 9 to the back-surface 81 of each back-cutting LED package structure 8 simultaneously, and liquefying the solid colloidal 72 for returning to the liquid resins 73; (5) taking each back-cutting LED package structure 8 attaching on the tape 9 out of the jig 7, wherein some residues exist on the surface of each back-cutting LED package structure 8; (6) cleaning the residues on the back-cutting LED package structure 8; and lifting off each back-cutting LED package structure 8 from the tape 9.

In the said patent, the heat generated from the light emitting unit 62 just directs to surroundings by the ceramic substrate 61. Thus, the heat-dissipating efficiency is not good. Furthermore, due to the manufacturing method of the back-cutting LED needs to have a cutting process, the manufacturing method become more complicated and the ceramic substrate is brittle in the cutting process. If concerning with the thin demand, the ceramic substrate may be damaged easily in the cutting process so that the operating process has more limit, and the production rate would be influenced. Meanwhile, because the ceramic substrate 61 is opaque, this makes the back-cutting LED luminous with limitation.

Figure 2:
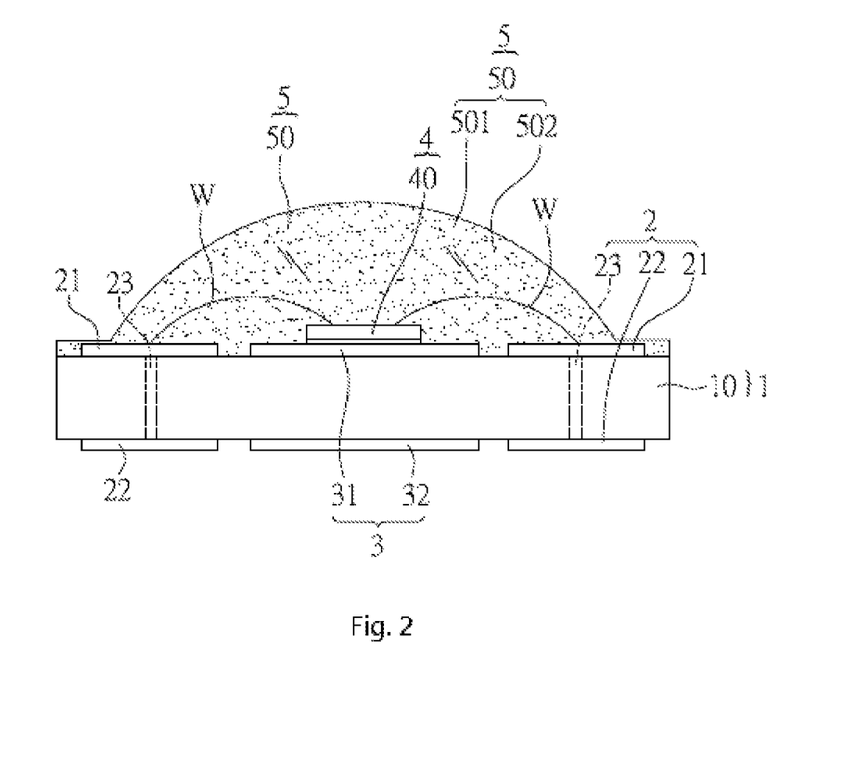
FIG. 2 is a schematic view illustrating a conventional LED configuration.

TW patent publication No. 201210093 discloses a LED having a preferred heat-dissipating efficiency. Referring to FIG. 2 of No. 201210093, the LED includes a substrate unit 1, a silver conductive unit 2, a heat-dissipating unit 3, a light emitting unit 4, and a packaging unit 5. The substrate unit 1 includes a ceramic substrate 10. The silver conductive unit 2 includes two top conductive pads 21 disposed on the upper surface of the ceramic substrate 10, two bottom conductive pads 22 disposed on the lower surface of the ceramic substrate 10, and multiple penetrating conductive layers 23 penetrating the ceramic substrate 10 and coupling between each top conductive pad 21 and each bottom conductive pad 22. The heat-dissipating unit 3 includes a top heat-dissipating block 31 disposed on the upper surface of the ceramic substrate 10 and a bottom heat-dissipating block 32 disposed on the lower surface of the ceramic substrate 10. The light emitting unit 4 includes a light emitting element 40 disposed on top heat-dissipating block 31 and coupling between two top conductive pads 21 by two conductive wires W. The packaging unit 5 includes a package resin 50 disposed on the silver conductive unit 2 and the heat-dissipating unit 3 and covered the light emitting element 40. The package resin 50 can be made from a light-permitting resin 501 (e.g. silicone or epoxy) and phosphor powders 502.

In the said patent, the heat generated from the light emitting element 40 is conducted to surroundings by the top heat-dissipating block 31, the ceramic substrate 10, and the bottom heat-dissipating block 32, so that the heat-dissipating efficiency for the LED increases. Although the said patent can increases the heat-dissipating efficiency of prior LED package structure, but the LED thickness of the said patent is still too thick in the trend of thin LCD design. In addition, due to the design of the heat-dissipating element is complicated, the yield rate or production rate for the LED is not good. Furthermore, the method of manufacturing LED also has the cutting process similar to the said patent NO. 201304196. Therefore, the LED manufacturing process of No. 201210093 is complicated, and the ceramic substrate 10 is damaged easily. Meanwhile, due to the ceramic substrate 10 is opaque, this makes the LED luminous with limitation.

Figure 3:
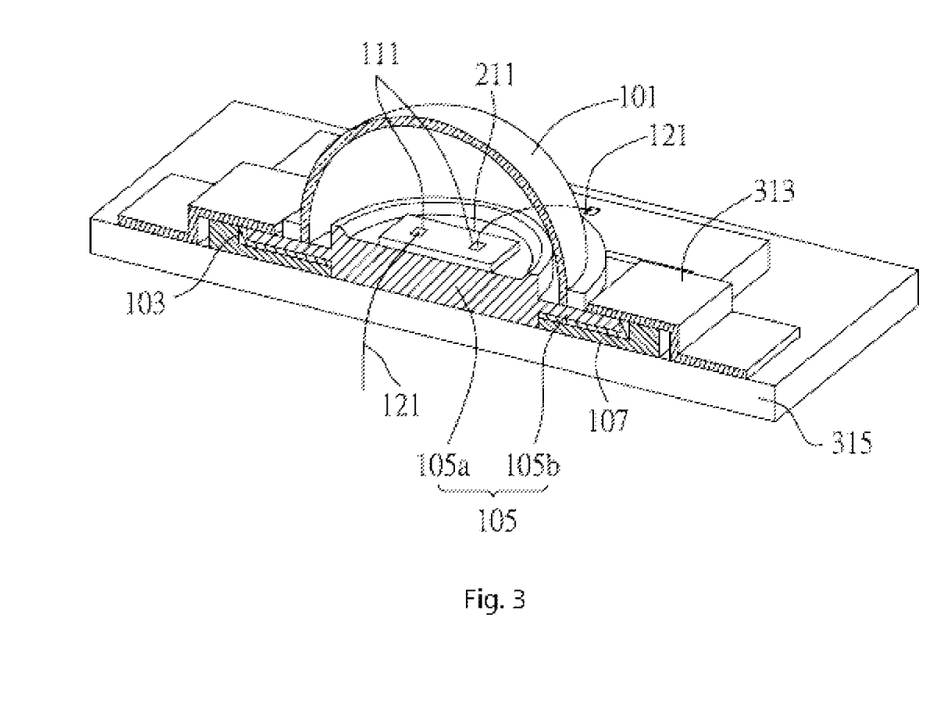
FIG. 3 is a schematic view illustrating conventional LED configuration.

TW patent publication No. 200847476 discloses a light emitting diode package with two heat-dissipating paths. Referring to FIG. 3 of No. 200847476, the light emitting diode package includes a lens structure 101, a heat-dissipating material 105, a circuit board 107, a plastic cover 103, a LED chip 211, a ladder-type heat-dissipating clip 313, and a heat-dissipating substrate 315. The heat-dissipating material 105 includes a body portion 105a for carrying the LED chip 211 and an extending area 105b coupled with the body portion 105a. The LED chip 211 is coupled to the circuit board 107 by the conductive wire 121. The material of the heat-dissipating material 105 can be a metallic or ceramic material. The material of the lens structure 101 can be a polycarbonate or a silicon resin. The material of the heat-dissipating substrate 315 can be a metallic or non-metallic material. The heat-dissipating substrate 315 also can be a printed circuit board, a metal core printed circuit board, or a ceramic substrate. The material of the ladder-type heat-dissipating clip 313 can be a metallic or non-metallic material.

In the said patent, the heat generated from the LED chip 211 just directs to the heat-dissipating substrate 315 and surroundings by the body portion 105a and the extending area 105b of the heat-dissipating material 105 respectively. At the same time, the extending area 105b of the heat-dissipating material 105 and the heat-dissipating substrate 315 are buckled by the ladder-type heat-dissipating clip 313 to make the LED chip 211, the heat-dissipating material 105, and the heat-dissipating substrate 315 contact tightly, and further increase the heat-dissipating efficiency more. However, although the said patent can overcome the question of poor heat-dissipating efficiency in prior LED package structure, but the LED thickness of the said patent is still too thick in the trend of thin LCD design. In addition, due to the design of the heat-dissipating element is complicated, the production rate is not good. Meanwhile, due to the heat-dissipating material 105 is opaque, this makes the LED luminous with limitation.

SUMMARY OF THE INVENTION

Therefore, an object of the present invention is to provide a white light emitting diode which being capable of thinning, high heat-dissipating efficiency, simple configuration, having no additional heat-dissipating fins, and luminance.

Thus, the chip-type white light emitting diode of the present invention comprises:

a substrate layer, being made from a curing reaction of first mixture, and the first mixture includes a curable resin, a curing agent, a phosphor material, and a modified thermal conductive nano-material, wherein the modified thermal conductive nano-material being made from a thermal conductive nano-material and a silane compound:

two conductive frames, each conductive frame having an end portion connected with the substrate layer;

a light emitting unit, disposed on a surface of the substrate layer;

two conductive wires, connected to the light emitting unit respectively, and each conductive wire connects to the corresponding conductive frame; and a packaging element, covering the conductive wires and the light emitting unit, and the packaging element being made from a curing reaction of second mixture, and the second mixture includes a curable resin, a curing agent, phosphor material, and a modified thermal conductive nano-material, wherein the modified thermal conductive nano-material being made from a thermal conductive nano-material and a silane compound.

Preferably, the white light emitting diode is chip-like with an average thickness ranging from 0.35 mm to 5 mm. More preferably, the white light emitting diode is chip-like with an average thickness ranging from 0.5 mm to 3.5 mm.

The conductive frame needs to have electrical transport characteristics. Preferably, part of each conductive frame is embedded in the substrate layer. The conductive wire needs to electrical transport to conductive wire of the light emitting unit.

In order to increase the heat-dissipating area, the white light emitting diode of the present invention further comprises a boron nitride film covered on the substrate layer and/or the packaging element preferably. The boron nitride film being in average thickness ranging from 300 mm to 350 mm.

Preferably, the light emitting unit is a violet light emitting diode die.

Preferably, the light emitting unit is a blue light emitting diode die.

Preferably, the curable resin is an epoxy, a silicon resin, or such a combination thereof. More preferably, the epoxy is an aliphatic epoxy or a alicyclic epoxy, wherein the alicyclic epoxy is a phenyl-containing alicyclic epoxy. More preferably, the silicon resin is a benzene ring-containing silicon resin.

The curing agent, such as but not limited to, a methyl-hexahydrophthalic anhydride or a platinum tetrachloride.

Preferably, the phosphor material is a yellow phosphor material or a red phosphor material.

Preferably, the yellow phosphor material is an yttrium aluminum garnet yellow phosphor material.

Preferably, the yellow phosphor material has formula (I):

$$M^1{}_yM^2{}_5O_z\,N_x{:}M^3{}_w \tag{I}$$

wherein, $M^1$ being $Sc^{3+}$, $Y^{3+}$, $La^{3+}$, $Sm^{3+}$, $Gd^{3+}$, $Pm^{3+}$, $Er^{3+}$, $Lu^{3+}$, or such a combination thereof; $M^2$ being $Al^{3+}$, $In^{3+}$, $Ga^{3+}$, or such a combination thereof; $M^3$ being $Tm^{3+}$, $Bi^{3+}$, $Tb^{3+}$, $Ce^{3+}$, $Eu^{3+}$, $Mn^{3+}$, $Er^{3+}$, $Yb^{3+}$, $Ho^{3+}$, $Gd^{3+}$, $Pr^{3+}$, $Dy^{3+}$, $Nd^{3+}$, or such a combination thereof; $3 \le x \le 8$, $2.7 \le y \le 3$, $0 \le z \le 7.5$, and $0 < w \le 0.3$.

Preferably, the yellow phosphor material, such as but not limited to, nitrogen compounds yellow phosphor powders (Y2.93Ce0.05Al5O4.5N5), an yttrium aluminum garnet yellow phosphor material (Y2.95Al5O12: Ce0.05).

Preferably, the thermal conductive nano-material is an aluminum oxide/alumina, an aluminum nitride, a silicon dioxide, a boron nitride, or such a combination thereof.

Preferably, the particle size of the thermal conductive nano-material is not more than 50 nm. More preferably, the particle size of the thermal conductive nano-material is not more than 20 nm.

The manufacturing method of the modified thermal conductive nano-material, comprises the steps: First, mixing liquid silane compound and solvent (e.g. water or Ethanol etc.); Next, adding the thermal conductive nano-material; Then, removing solvent. Preferably, the modified thermal conductive nano-material is made from the thermal conductive nano-material surrounded by the silane compound.

The modified thermal conductive nano-material of the present invention can use the silane compound to reduce the reaction between the thermal conductive nano-material and the curable resin, further control the viscosity for preferred uses. In the present invention, the viscosity of the modified thermal conductive nano-material being less than 30,000 cps.

Preferably, the silane compound being in a weight amount ranging from 1 wt % to 2 wt %, for 100 wt % of the total of the modified thermal conductive nano-material. Preferably, the silane compound, such as but not limited to, 3-glycidoxypropyltrimethoxysilane etc.

In order to make the chip-type white light emitting diode of the present invention have preferred heat-dissipating efficiency and light transmittance, preferably, the modified thermal conductive nano-material being in a weight amount ranging from 5 wt % to 70 wt %, for 100 wt % of the total of the first mixture.

In order to have preferred heat-dissipating efficiency and light transmittance in the chip-type white light emitting diode of the present invention, preferably, the modified thermal conductive nano-material being in a weight amount ranging from 5 wt % to 70 wt %, for 100 wt % of the total of the second mixture.

In the present invention, the first mixture and the second mixture can be made respectively in a general mixing method (e.g. mixer or dispersion machine) to be gel state by uniformly mixing of the curable resin, the curing agent, the phosphor material, and the modified thermal conductive nano-material.

Worth mentioning is, the poor heat-dissipating efficiency is the main issue which influences the lifetime of the LED die and the luminance. The LED die will have the cracking damage seriously when the temperature is higher than 120° C. However, the power is needed to upgrade for increasing the luminance of LED, and then results the issue that the temperature will be too high. As a result, the lifetime of the LED is reduced. In the present invention, the chip-type white light emitting diode has more preferably heat-dissipating efficiency by improving materials and the configuration thereof. When the power is 1 W, the temperature of the LED die is under 80° C. by adding the modified thermal conductive nano-material and having the thickness controlled between 0.35 mm~1.5 mm. Further, the surface temperature of the white light emitting diode is under 50° C. in the present invention.

In the present invention, when the thickness of the chip-type white light emitting diode is 1.5 mm, the load power is about 1.5 W. When the load power is higher than 1.5 W, there will be having an issue of overheat for the LED die easily. When the entirety thickness of the white light emitting diode in the present invention increases, the heat-dissipating efficiency of the white light emitting diode will be improved. The thickness of the white light emitting diode increases 0.8 mm~1 mm per 1 W since the load power is 1.5 W. Therefore, when the load power is 2.5 W, the temperature of the LED die keep under 95° C. by increasing the thickness of the white light emitting diode to 2.3~2.5 mm. If the load power is upgraded to 3.5 W, the thickness of the white light emitting diode would be increased to 3.1 mm~3.5 mm, wherein the temperature of the LED die still can keep under 105° C. which is fitted the demand that the temperature of the LED die is under 120° C.

Thus, the load power can upgrade to 3.5 W by controlling the thickness of the white light emitting diode, and still keep the temperature of the LED die under 120° C. This increases the lifetime and the luminance of the white light emitting diode in the present invention.

In the present invention, a second object is to provide a manufacturing method of the chip-type white light emitting diode which being a simple processes for mass production.

In the present invention, the manufacturing method of the chip-type white light emitting diode comprises the steps:

providing a first mixture and two conductive frames, wherein the first mixture includes a curable resin, a curing agent, a phosphor material, and a modified thermal conductive nano-material, wherein the modified thermal conductive nano-material being made from a thermal conductive nano-material and a silane compound;

making part of each conductive frame contact with the first mixture, applying a energy to the first mixture for a curing reaction, and then a substrate layer being made, wherein part of each conductive frame and the substrate layer are connected;

providing a light emitting unit which being disposed on a surface of the substrate layer;

providing two conductive wires, wherein the conductive wires connected to the light emitting unit respectively, and each conductive wire connects to the corresponding conductive frame; and providing a second mixture, including a curable resin, a curing agent, a phosphor material, and a modified thermal conductive nano-material, wherein the modified thermal conductive nano-material being made from a thermal conductive nano-material and a silane compound;

making the second mixture cover on the conductive wires and the light emitting unit, applying a energy to the second mixture for a curing reaction, and then a packaging element being made.

The materials of the first mixture and the second mixture, the conductive frame, and the conductive wire as mentioned above, so the detailed descriptions are omitted here.

The energy applied to the first mixture or the second mixture is heat or light which depends on the kind of the adding curing agent.

In the present invention, a third object is to provide a chip-type white light emitting diode which being capable of thinning, high heat-dissipating efficiency, simple configuration without additional heat-dissipating fins, and luminance.

Thus, the chip-type white light emitting diode of the present invention comprises:

a substrate layer, being made from a curing reaction of the third mixture, and the third mixture includes a curable resin, a curing agent, and a phosphor material;

two conductive frames, each of the two conductive frames having an end portion conducted with the substrate layer;

a light emitting unit, disposed on a surface of the substrate layer;

two conductive wires, connected to the light emitting unit respectively, and each conductive wire connects to the corresponding conductive frame; and a packaging element, covering the conductive wires and the light emitting unit, and the packaging element being made from the a curing reaction of a fourth mixture, and the fourth mixture includes a curable resin, a curing agent, and a phosphor material;

wherein the white light emitting diode is chip-like with an average thickness ranging less than 0.5 mm.

The curable resin, the curing agent, and the phosphor material of the third mixture and the fourth mixture are the same as the curable resin, the curing agent, and the phosphor material of the first mixture respectively, so the detailed descriptions are omitted here.

In the present invention, a fourth object is to provide a packaging material with a high heat-dissipating efficiency.

Thus, the present invention packaging material comprises:

a curable resin, a curing agent, a phosphor material, and a modified thermal conductive nano-material, wherein the modified thermal conductive nano-material being made from a thermal conductive nano-material and a silane compound, and the thermal conductive nano-material is aluminum oxide/alumina, aluminum nitride, silicon dioxide, boron nitride, or such a combination thereof.

In order to make the chip-type white light emitting diode of the present invention have preferred heat-dissipating efficiency and light transmittance, preferably, the modified thermal conductive nano-material being in a weight amount ranging from 5 wt % to 70 wt %, for 100 wt % of the total of the packaging material.

The curable resin, the curing agent, the phosphor material, and the silane compound as mentioned above, so the detailed descriptions are omitted here.

In the present invention, the packaging material can be made in a general mixing method (e.g. mixer or dispersion machine) to be gel state by uniformly mixing of the curable resin, the curing agent, the phosphor material, and the modified thermal conductive nano-material. Further, in order to avoid the existence of air in the packaging material to influences the luminous efficiency and the heat-dissipating efficiency, preferably, the manufacturing method of the packaging material comprises the steps: providing a sol containing a phosphor material, a modified thermal conductive nano-material, and a solvent and a mixture containing a curable resin and a curing agent; mixing the mixture and the sol; next, removing the solvent in vacuum to be a gel state of the packaging material. The manufacturing method reduces the existence of air by filling the solvent in the space of these materials, especially the space between a phosphor and a modified thermal conductive nano-material.

The effects of the present invention are: in the present invention, the substrate layer and the packaging element of the chip-type white light emitting diode both include the modified thermal conductive nano-material. Relative to the design of previous LED heat-dissipating structure, the chip-type white light emitting diode of the present invention being with simple configuration and a high heat-dissipating efficiency without additional heat-dissipating fins. Relative to the substrate layer of previous LED with metallic and opaque material, the present invention is capable of luminous. Furthermore, relative to the manufacturing method of previous LED, in the present invention, the material of the substrate layer is a resin material without a cutting process, and the present manufacturing method being a simple process for mass production.

BRIEF DESCRIPTION OF THE DRAWINGS

Other features and advantages of the present invention will become apparent in the following detailed description of the preferred embodiments with reference to the accompanying drawings, of which.

DESCRIPTION OF EMBODIMENTS

Example 1

Mixing the phosphor material, the modified thermal conductive nano-material, the ethanol, the curable resin, and the curing agent to be a sol. Next, removing the solvent removing in vacuum to be a gel stat. The mixture in the gel stat can be as the first mixture, the second mixture, and the packaging element. The kinds and volume of the materials as shown in table 1.

Example 2 to 5

Example 2 to 5 have the same steps to manufacture the first mixture, the second mixture, and the packaging material with example 1, the difference is: changes the kinds and volume of the materials, as shown in table 1.

Measurement of light transmittance (%): curing the first mixture and the second mixture of example 1-5 to form measuring samples which the thickness is 1 mm, and disposing the measuring samples in ATAGO refractometer (type: RX-7000α) for measurement.

TABLE 1

| unit: g | | example 1 | 2 | 3 | 4 | 5 |
|---|---|---|---|---|---|---|
| curable resin | A-1 | 17.5 | 17.5 | 17.5 | 17.5 | — |
|  | A-2 | 17.5 | 17.5 | 17.5 | 17.5 | 35 |
| curing agent | B-1 | 17.5 | 17.5 | 17.5 | 17.5 | — |
|  | B-2 | 17.5 | 17.5 | 17.5 | 17.5 | 35 |
| phosphor material | C-1 | 15 | 20 | 20 | — | — |
|  | C-2 | — | — | 5 | — | — |
|  | C-3 | — | — | — | 15 | 5.6 |
| modified thermal | D-1 | 15 | — | — | — | — |
| conductive | D-2 | — | 10 | — | — | 17.5 |
| nano-material | D-3 | — | — | 5 | — | — |
|  | D-4 | — | — | — | 15 | — |
| light transmittance (%) | | | | >94% | | |

—: represents non-addition;
A-1: being made from 3,4-epoxycyclohexylmethyl-3,4-epoxycyclohexane carboxylate by polymerization reaction;
A-2: being made from dimethyldihydroxy silane by polymerization reaction;
B-1: methylhexahydrophthalic anhydride;
B-2: platinum tetrachloride;
C-1: nitrogen compounds yellow phosphor powders, Y2.93Ce0.05Al5O4.5N5;
C-2: red phosphor material, Y2.15Al5MnO.05O4.5N5;
C-3: yttrium aluminum garnet yellow phosphor material, Y2.95Al5O12: Ce0.05;
D-1: being made from 3-(methacryloyloxy)propyltrimethoxysilane and silicon dioxide, the average of particle size is less than 10 nm;
D-2: being made from 3-(methacryloyloxy)propyltrimethoxysilane and aluminum oxide/alumina, the average of particle size is 20 nm;
D-3: being made from 3-(methacryloyloxy)propyltrimethoxysilane and aluminum nitride, the average of particle size is 50 nm;
D-4: being made from 3-(methacryloyloxy)propyltrimethoxysilane and boron nitride, the average of particle size is less than 20 nm.

Embodiment 1 to 8

Figure 4:
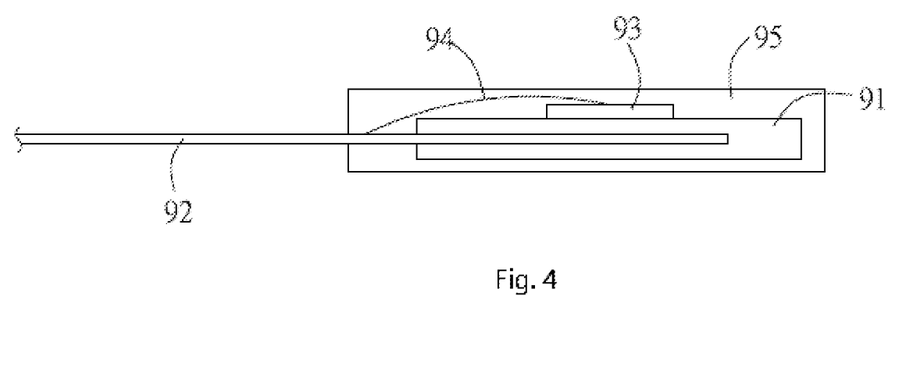
FIG. 4 is a schematic side cross-sectional view illustrating the preferred embodiment of the configuration of a chip-type white light emitting diode according to the present invention.

Referring to FIG. 4, in a preferred embodiment of the present invention, the chip-type white light emitting diode comprises a substrate layer 91, two conductive frames 92, a light emitting unit 93, two conductive wires 94, and a packaging element 95.

The substrate layer 91 is made from a curing reaction of the mixture which being one of example 1-5. Part of each conductive frame of the conductive frame 92 is embedded in the substrate layer 91, and part of the conductive frame is exposed out of the substrate layer 91. The light emitting unit 93 disposed on the surface of the substrate layer 91 is a gallium nitride LED die which the thickness is 0.1 mm and luminous with a wavelength ranging from 430 to 465 nm. The conductive wires 94 are connected to the gallium nitride LED die respectively, and each conductive wire 94 is connected to the corresponding conductive frame 92. The packaging element 95 covers the conductive wires 94 and the gallium nitride LED die, and the packaging element 95 is made from the curing reaction of the mixture which being one of example 1-5.

The two methods illustrating below are practiced in embodiment 1 to 8, wherein the condition of the substrate layer thickness is illustrated in table 2.

[Method 1]

In the present invention, one of the manufacturing methods of the chip-type white light emitting diode comprises the steps:

step 1: providing several conductive frames arranged spaced and series, wherein each two conductive frames be one set, and each set is disposed in a hollow jig which inner surface is formed with a boron nitride film.

step 2: directing the mixture which being one of example 1-5 into the hollow jig, wherein part of the conductive frame of each set is connected to the mixture, and then practicing a curing reaction of the mixture to form a substrate layer, and then a first unit is formed, wherein part of each conductive frame is connected to the substrate layer.

step 3: providing a light emitting unit, disposed on surface of the substrate layer of the first unit.

step 4: providing several conductive wires, wherein each two conductive wires be one set, and the conductive wires of one set are connected to the light emitting unit respectively, and each conductive wire connects to the corresponding conductive frame, and then a second unit is formed.

step 5: disposing the second unit in the hollow jig, and directing the mixture which being one of example 1-5 into the hollow jig.

step 6: covering the mixture on the second unit and applying a energy to the mixture, and practicing a curing reaction of the mixture to form a packaging element, and then the chip-type white light emitting diode of the present invention is formed.

Figure 5:
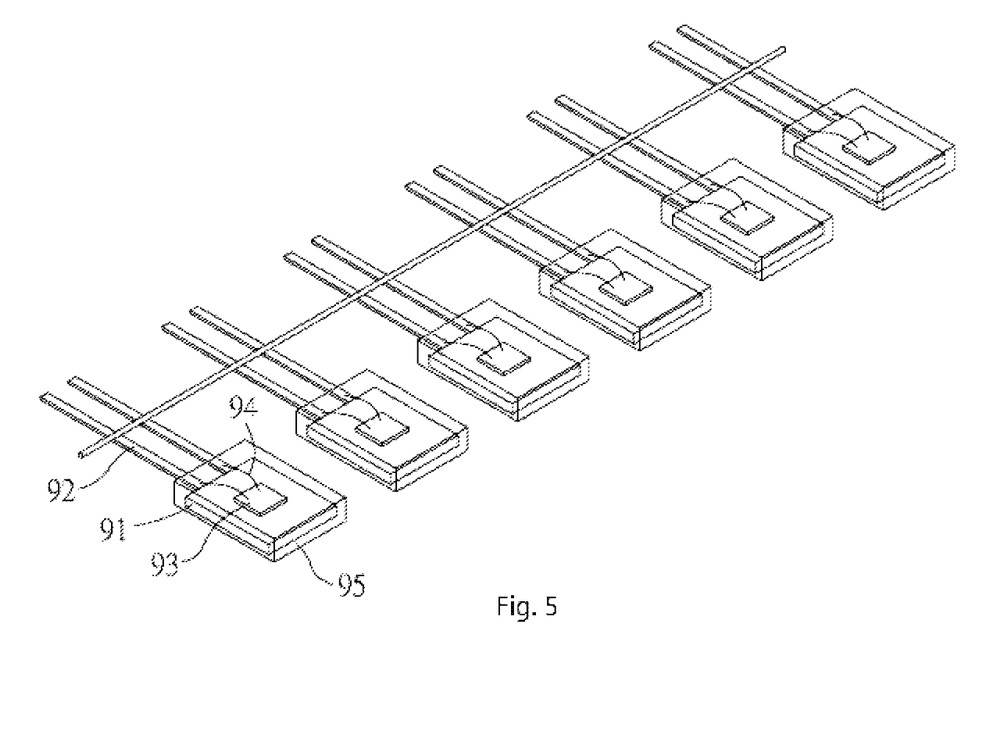
FIG. 5 is a schematic view illustrating the configuration of a chip-type white light emitting diode manufactured by a first manufacturing method of the white light emitting diode method in the present invention.

Referring to FIG. 5, illustrating the chip-type white light emitting diode of the preferred embodiment in the present invention manufactured by the said manufacturing method of the chip-type white light emitting diode method. The manufacturing method is a perfusion-type manufacturing method, and the yield of the manufacturing method is at least 18,000 pieces per hour.

[Method 2]

In the present invention, another manufacturing method of the chip-type white light emitting diode comprises the steps:

step 1: disposing the mixture which being one of example 1-5 on a releasable substrate layer by a screen printing method, and several pieces of discontinuous films are formed.

step 2: providing several conductive frames, wherein each two conductive frames be one set.

step 3: each set is corresponding to one piece of film, and part of conductive frame of each set is connected to the film, and then applying a energy to the film to practice a curing reaction, and then a substrate layer is formed, wherein part of each conductive frame and the substrate layer are connected.

step 4: providing a light emitting unit which being disposed on a surface of the substrate layer.

step 5: providing several conductive wires, wherein each two conductive wires be one set, and the conductive wires of one set are connected to the light emitting unit respectively, and each conductive wire is connected to the corresponding conductive frame.

step 6: providing the mixture which being one of example 1-5, and covering the conductive wires and light emitting unit by a screen printing method, and then applying a energy to the mixture to practice a curing reaction, and then a packaging element is formed, and the chip-type white light emitting diode of the present invention is formed.

<<Result and Discuss>>

From the results in table 2, it is known that: in embodiment 1 to 4, and being in entirety thickness ranging 0.7 to 1.5 mm, and the temperature measurement being in 1 W power. When the entirety thickness be increased, the surface temperature and the center temperature be decreased correspondingly, less than 50° C. and 80° C. respectively. Therefore, the center temperature of the light emitting unit can be sure to keep under 120° C. Relative to the design of the heat-dissipating structure in the previous LED, the chip-type white light emitting diode of the present invention being with a simple configuration and a high heat-dissipating efficiency without additional heat-dissipating fins.

In embodiment 5 to 8, the entirety thickness increases since 1.5 mm to 5 mm gradually, and the power is upgraded since 1.5 W to 3.5 W, the center temperature cab be less than 105° C. Therefore, the present invention can have a good heat-dissipating efficiency in high power state (>1.5 W) by increasing the entirety thickness, further avoid the LED die cracking, and then reduce lifetime and luminance when the center temperature is too high. Therefore, there can be a good heat-dissipating efficiency when the power is less than 3.5 W by adjusting the entirety thickness, and further upgrades the whole lifetime and luminance.

In addition, the mixture in embodiment 1 to 8 has a preferably light transmittance (referring to table 1). Therefore, light emitted from the LED die can transmit the substrate layer and the packaging element of the present invention, and have a luminous effect.

From above, in the present invention, the substrate layer and the packaging element of the chip-type white light emitting diode both include the modified thermal conductive nano-material. Relative to the design of the heat-dissipating structure in the previous LED, the chip-type white light emitting diode of the present invention being with a simple configuration and a high heat-dissipating efficiency without additional heat-dissipating fins. Relative to the substrate layer of previous LED with metallic and opaque material, the present invention is capable of luminous. Furthermore, relative to the manufacturing method of previous LED, in the present invention, the material of the substrate layer is a resin material without a cutting process, and the present manufacturing method being a simple process for mass production. Therefore, the objects of the present invention can be achieved.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the

TABLE 2

| Embodiment | mixture | substrate layer thickness (mm) | Entirety thickness (mm) | Power (W) | Surface temperature (° C.) | center temperature (° C.) |
|---|---|---|---|---|---|---|
| 1 | example 1 | 0.7 | 1.5 | 1 | 47 | 61 |
| 2 | example 2 | 0.4 | 1 | 1 | 48 | 64 |
| 3 | example 3 | 0.3 | 0.7 | 1 | 49 | 79 |
| 4 | example 4 | 0.7 | 1.5 | 1 | 42 | 58 |
| 5 | example 5 | 0.7 | 1.5 | 1.5 | 54 | 67 |
| 6 | example 5 | 0.7 | 2.5 | 2.5 | 65 | 89 |
| 7 | example 5 | 0.7 | 3.5 | 3.5 | 71 | 98 |
| 8 | example 5 | 0.7 | 5 | 3.5 | 72 | 101 | temperature(° C.)measurement: applying potentials to the conductive frames of the chip-type white light emitting diode which being in embodiment 1-8, and control the power 2 hours later, and measuring the surface temperature and the center temperature of the packaging element respectively by infrared inspection equipment.

appended claims should be accorded the broadest interpretation so as to encompass all such modifications and similar arrangements.

What is claimed is:

1. A white light emitting diode, comprising:
a substrate layer, being made from a curing reaction of a first mixture, and the first mixture includes a curable resin, a curing agent, a phosphor material, and a modified thermal conductive nano-material, wherein the modified thermal conductive nano-material being made from a thermal conductive nano-material and a silane compound;
two conductive frames, each conductive frame having an end portion connected with the substrate layer;
a light emitting unit, disposed on a surface of the substrate layer;
two conductive wires, connecting to the light emitting unit respectively, and each conductive wire connecting to the corresponding conductive frame; and
a packaging element, covering the conductive wires and the light emitting unit, and the packaging element being made from a curing reaction of a second mixture, and the second mixture includes a curable resin, a curing agent, a phosphor material, and a modified thermal conductive nano-material, wherein the modified thermal conductive nano-material being made from a thermal conductive nano-material and a silane compound.

2. The white light emitting diode of claim 1, further comprising a boron nitride film, covering on the substrate layer and/or the packaging element.

3. The white light emitting diode of claim 1, wherein the thermal conductive nano-material being an aluminum oxide/alumina, an aluminum nitride, a silicon dioxide, a boron nitride, or such a combination thereof.

4. The white light emitting diode of claim 1, wherein the particle size of the thermal conductive nano-material is not more than 50 nm.

5. The white light emitting diode of claim 1, wherein the light emitting unit is a violet light emitting diode die.

6. The white light emitting diode of claim 1, wherein the light emitting unit is a blue light emitting diode die.

7. The white light emitting diode of claim 1, wherein the chip-type white light emitting diode is chip-like with an average thickness ranging from 0.35 mm to 5 mm.

8. The white light emitting diode of claim 1, wherein the chip-type white light emitting diode is chip-like with average thickness ranging from 0.5 mm to 3.5 mm.

9. The white light emitting diode of claim 1, wherein part of each conductive frame is embedded in the substrate layer.

10. The white light emitting diode of claim 1, wherein the curable resin being epoxy, silicon resin, or such a combination thereof.

11. The white light emitting diode of claim 10, wherein the epoxy being aliphatic epoxy, or alicyclic epoxy.

12. The white light emitting diode of claim 1, wherein the phosphor material being a yellow phosphor material or a red phosphor material.

13. The white light emitting diode of claim 12, wherein the yellow phosphor material being a yttrium aluminum garnet yellow phosphor material.

14. The white light emitting diode of claim 12, wherein the yellow phosphor material having formula (I):

$$M^1{}_yM^2{}_5O_zN_x{:}M^3{}_w \qquad (I)$$

wherein, $M^1$ being $Sc^{3+}$, $Y^{3+}$, $La^{3+}$, $Sm^{3+}$, $Gd^{3+}$, $Pm^{3+}$, $Er^{3+}$, $Lu^{3+}$, or such a combination thereof; $M^2$ being $Al^{3+}$, $In^{3+}$, $Ga^{3+}$, or such a combination thereof; $M^3$ being $Tm^{3+}$, $Bi^{3+}$, $Tb^{3+}$, $Ce^{3+}$, $Eu^{3+}$, $Mn^{3+}$, $Er^{3+}$, $Yb^{3+}$, $Ho^{3+}$, $Gd^{3+}$, $Pr^{3+}$, $Dy^{3+}$, $Nd^{3+}$, or such a combination thereof; $3 \leq x \leq 8$, $2.7 \leq y \leq 3$, $0 \leq z \leq 7.5$, and $0 < w \leq 0.3$.

15. A manufacturing method of white light emitting diode, comprising the steps of:
providing a first mixture and two conductive frames, wherein the first mixture includes a curable resin, a curing agent, a phosphor material, and a modified thermal conductive nano-material, wherein the modified thermal conductive nano-material being made from a thermal conductive nano-material and a silane compound;
making part of each conductive frame contact with the first mixture, and applying an energy to the first mixture for a curing reaction, and then a substrate layer being made, wherein part of each conductive frame being connected with the substrate layer;
providing a light emitting unit which being disposed on a surface of the substrate layer;
providing two conductive wires which being connected to the light emitting unit respectively, and each conductive wire being connected to the corresponding conductive frame; and
providing a second mixture, including a curable resin, a curing agent, a phosphor material, and a modified thermal conductive nano-material, wherein the modified thermal conductive nano-material being made from a thermal conductive nano-material and a silane compound;
making the second mixture cover on the conductive wires and the light emitting unit, applying an energy to the second mixture for a curing reaction, and then a packaging element being made.

16. The manufacturing method of white light emitting diode of claim 15, wherein the white light emitting diode is chip-like with an average thickness ranging from 0.35 mm to 5 mm.

17. The manufacturing method of white light emitting diode of claim 15, wherein the white light emitting diode is chip-like with an average thickness ranging from 0.5 mm to 3.5 mm.

* * * * *